(12) United States Patent
Beetz et al.

(10) Patent No.: US 6,392,207 B2
(45) Date of Patent: May 21, 2002

(54) ELECTRIC HEATING DEVICE, ESPECIALLY FOR USE IN MOTOR VEHICLES

(75) Inventors: Klaus Beetz, Karlsruhe; Franz Bohlender, Kandel, both of (DE)

(73) Assignee: Catem GmbH & Co. KG, Landau/Pfalz (DE)

( * ) Notice: Subject to any disclaimer, the term of this patent is extended or adjusted under 35 U.S.C. 154(b) by 0 days.

(21) Appl. No.: 09/861,872

(22) Filed: May 21, 2001

(51) Int. Cl.[7] ................................................. H05B 3/50
(52) U.S. Cl. ........................ 219/530; 219/540; 219/202; 219/541; 219/165; 219/80.3
(58) Field of Search ............................... 219/202, 530, 219/540, 541; 165/80.3

(56) References Cited

U.S. PATENT DOCUMENTS

| | | | | |
|---|---|---|---|---|
| 5,471,034 A | * | 11/1995 | Kawate et al. | 219/485 |
| 5,915,466 A | * | 6/1999 | Aakalu | 165/121 |
| 6,037,567 A | * | 3/2000 | Inoue et al. | 219/202 |
| 6,038,129 A | * | 3/2000 | Falaki et al. | 361/699 |
| 6,104,609 A | * | 8/2000 | Chen | 361/695 |
| 6,178,292 B1 | * | 1/2001 | Fukukoa et al. | 392/485 |
| 6,321,451 B1 | * | 11/2001 | Lee et al. | 29/890.03 |

FOREIGN PATENT DOCUMENTS

| | | | | |
|---|---|---|---|---|
| EP | 0840534 | 5/1998 | | H05B/1/02 |
| EP | 0901311 | 3/1999 | | H05B/3/12 |

* cited by examiner

*Primary Examiner*—Teresa Walberg
*Assistant Examiner*—Shawntina Fuqua
(74) *Attorney, Agent, or Firm*—Darby & Darby

(57) ABSTRACT

The present invention relates to an electric heating device which is especially conceived as a heating device for use in automotive vehicles. A plurality of heating elements, which are stacked so as to define a heating block, form together with a control device a structural unit. For this purpose, the control device is accommodated in a lateral bar of the frame by means of which the heating elements are held together. The air to be heated flows through the heating block as well as through windows provided in the lateral bar, past cooling elements which are respectively connected to the power-electronics components of the control device.

12 Claims, 5 Drawing Sheets

ELECTRIC HEATING DEVICE, ESPECIALLY FOR USE IN MOTOR VEHICLES

Figure 1A:
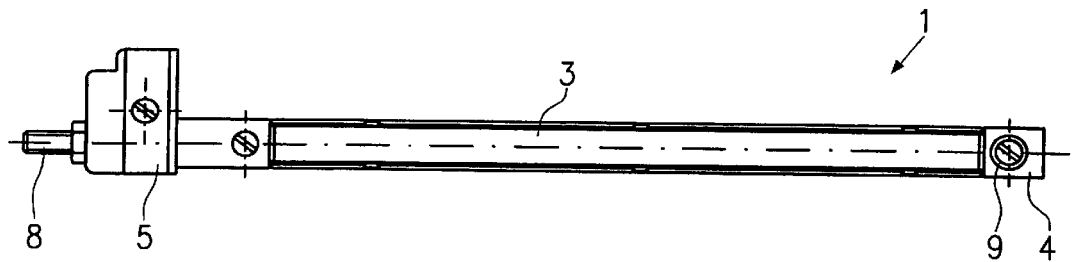

The present invention relates to an electric heating device for heating air, which is especially suitable for use as a supplementary electric heating in motor vehicles.

In motor vehicles heating devices or radiators are used for heating the vehicle interior and/or the engine. On the one hand, they are used when the engine is started, as long as the engine does not yet provide sufficient heat energy. On the other hand, especially consumption-optimized internal combustion engines make it necessary to use such heating devices in motor vehicles.

The use of such heating devices is, however, not restricted to the field of automotive vehicles. These heating devices are also suitable to be used for a great variety of other purposes, e.g. in the field of domestic installations (room air conditioning), industrial plants and the like.

EP-A2-0 901 311 discloses an electric heating means for motor vehicles. The heating device described comprises a plurality of heating elements which are combined so as to form a heating block. The heating block and a control device for controlling the heating elements are held in a common frame. In this way, the control device defines a structural unit together with the heating block held in the frame. The control device comprises a power electronics with electronic switches which are provided with cooling bodies. The control device is arranged in such a way that the main part of an air current to be heated flows through the heating block and that a boundary portion of said air current is applied to the control device for the purpose of cooling.

This known heating device is disadvantageous insofar as the air current flowing over the control device reduces the total effectiveness of the heating power. The part of the air current to be heated which passed the heating block and the part which flowed past the control device have different output temperatures. The output temperature of the air current which was applied to the control device is markedly lower than that of the main current. This results especially in an inhomogeneous air discharge temperature. In addition, the heating device will be less effective when air having a lower temperature flows in.

It is therefore the object of the present invention to provide an electric heating device by means of which more effective heating can be achieved.

This object is achieved by the features of claim 1.

According to the present invention, the air to be heated is not applied to the control device as a whole, but the amount of air passing through and used for cooling the power electronics can be controlled through window openings. In this way, an adaptation to the amount of air passing through the heating block is possible so that both amounts of air will have substantially the same output temperature. In this way, the effectiveness of the whole heating device will not be reduced by an air current which is diverted for cooling the control electronics.

According to an advantageous embodiment of the present invention, means for influencing the air current are provided within the area between opposed window openings. In this way, the air current can be conducted such that it is optimally applied to the cooling elements of the power electronics so that the maximum possible heating of the cooling air current will be achieved. A particularly advantageous variant can be accomplished by means of U-shaped cooling elements in the case of which additional air-conducting elements can be provided which project between the legs of the U-shaped cooling elements.

The cooling air can be heated still further, when it is also conducted over the components of the control device. For this purpose, the printed circuit board of the control device is preferably equipped with components on only one side thereof. A particularly simple application of air to the components can be achieved in this way. In addition, such an arrangement of the components is also particularly advantageous for reasons of production engineering.

In accordance with an advantageous embodiment of the present invention, the printed circuit board is arranged at right angles to the plane of the frame. This kind of arrangement permits, on the one hand, a simple application of air to the components. On the other hand, a small construction depth of the electric heating device can be achieved in this way.

The control device can be fixed in a particularly simple manner when the electric connection lugs of the heating elements, which project into the box of the lateral bar, are used for such fixing. For this purpose, spring elements which are complementary to the connection lugs can be provided on the printed circuit board. This embodiment permits, with the aid of the same means, electric contacting, e.g. for conducting the control currents for the heating elements, as well as mechanical fixing. This has the effect that the amount of material required, for an electric heating device according to the present invention and the investment in the production process of such an electric heating device will be reduced substantially.

Further advantageous embodiments of the present invention are disclosed in the subclaims.

Figure 1B:
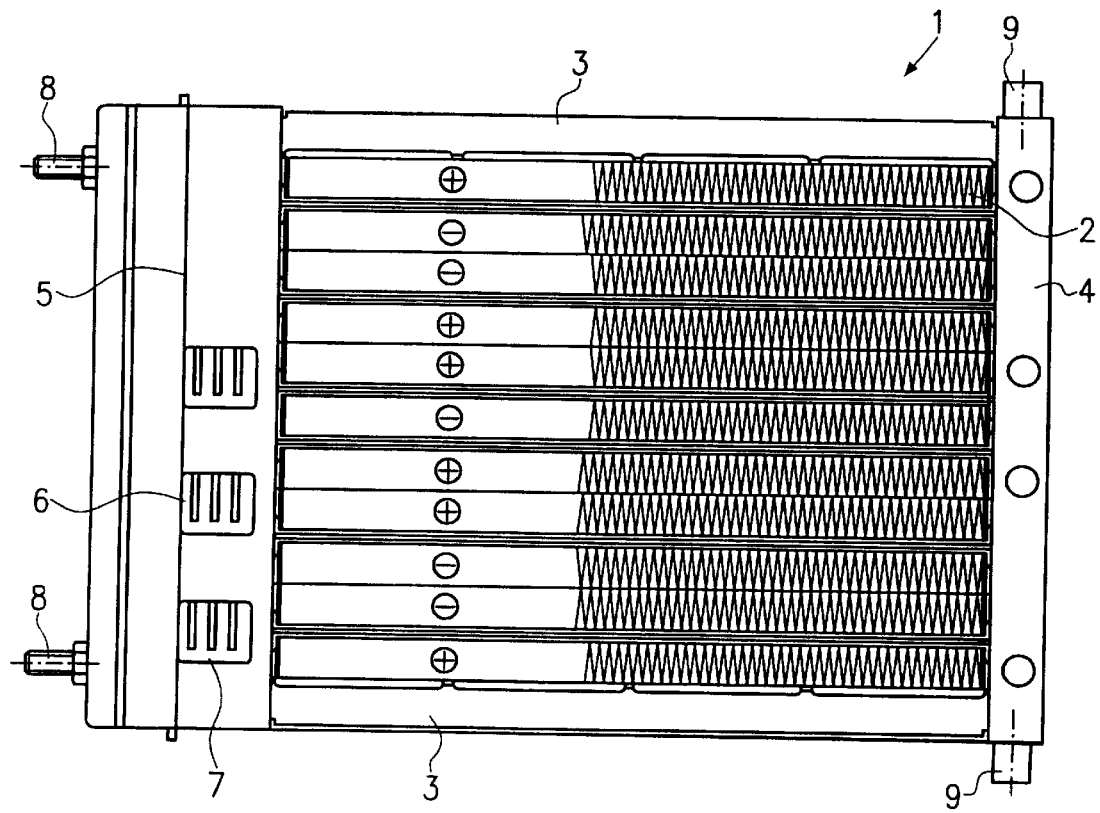
Figure 2:
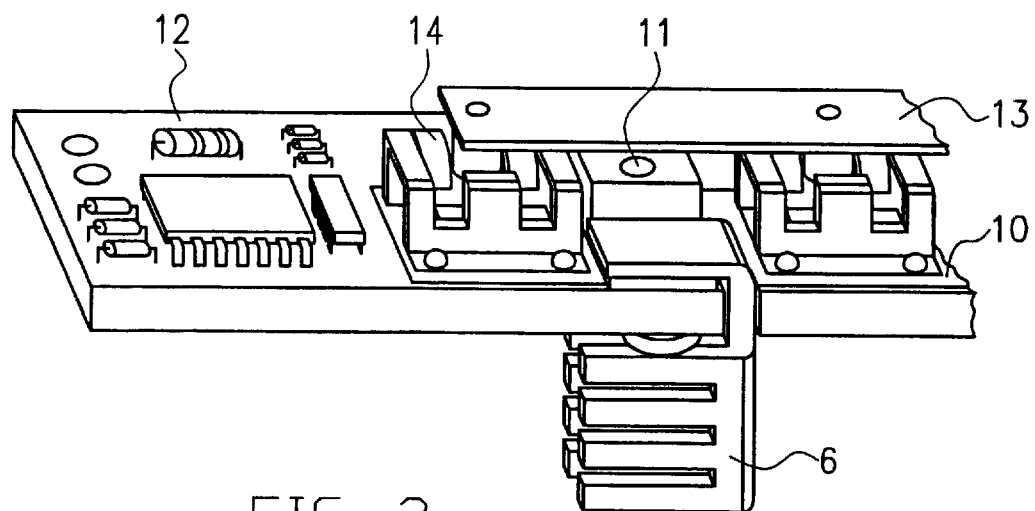
Figure 4:
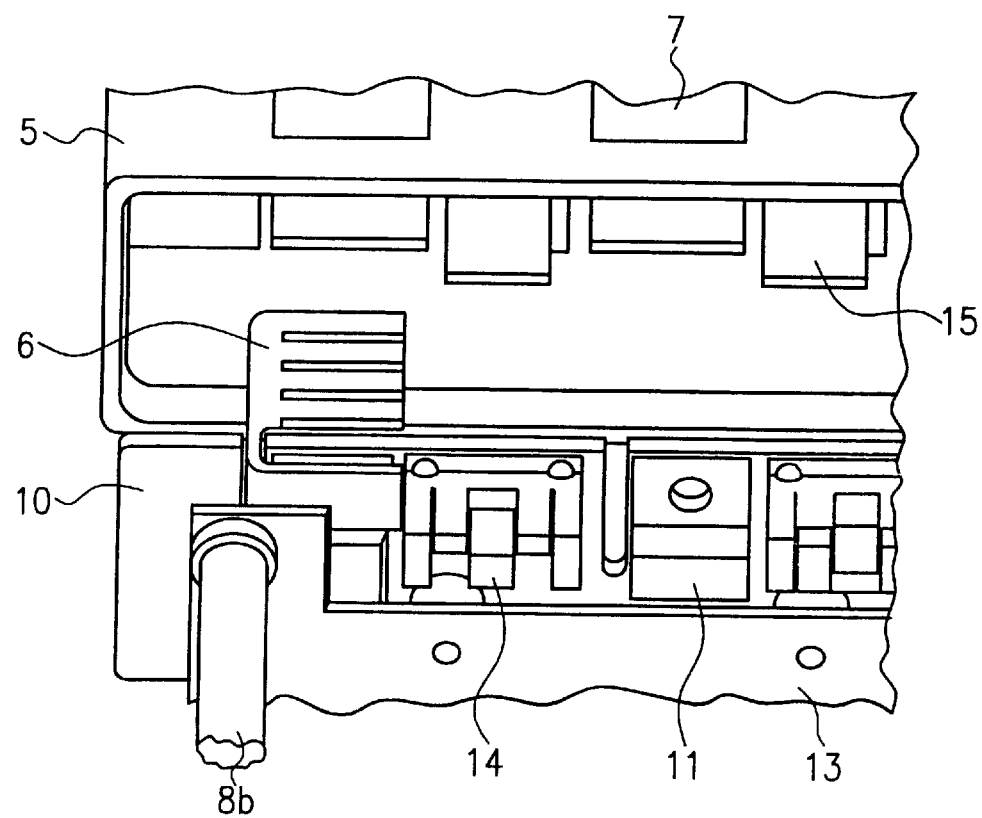
Figure 3:
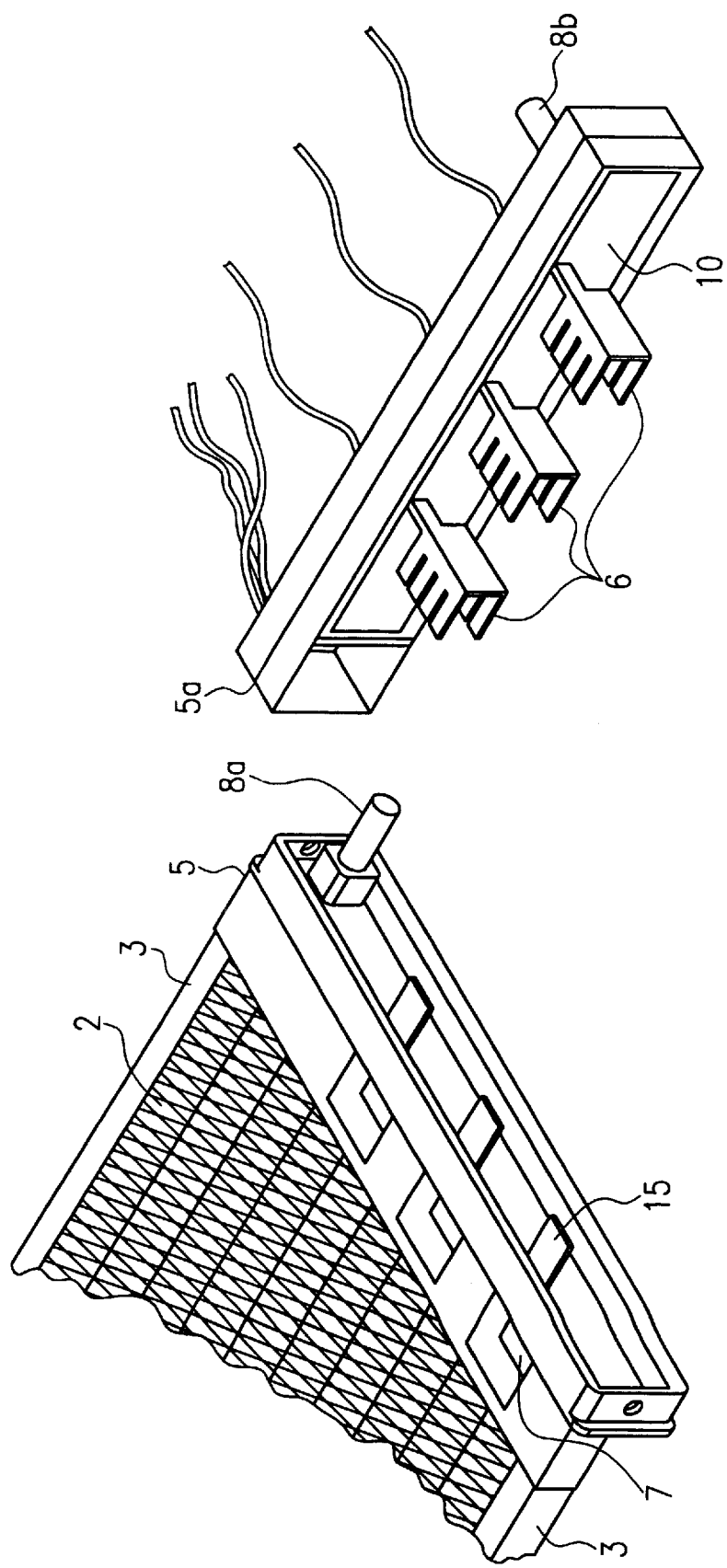

In the following, the present invention will be described with reference to the drawings enclosed, in which FIGS. 1a and 1b show a top view and a side view of an electric heating device according to the present invention, FIG. 2 shows a detail view of the printed circuit board of the control device, said printed circuit board being equipped with components, FIG. 3 shows a detail view of the box-shaped lateral bar and of the control device which is adapted to be inserted in said lateral bar, FIG. 4 shows a further detail view of the box-shaped lateral bar and of the control device which is adapted to be inserted in said lateral bar.

Figure 5A:
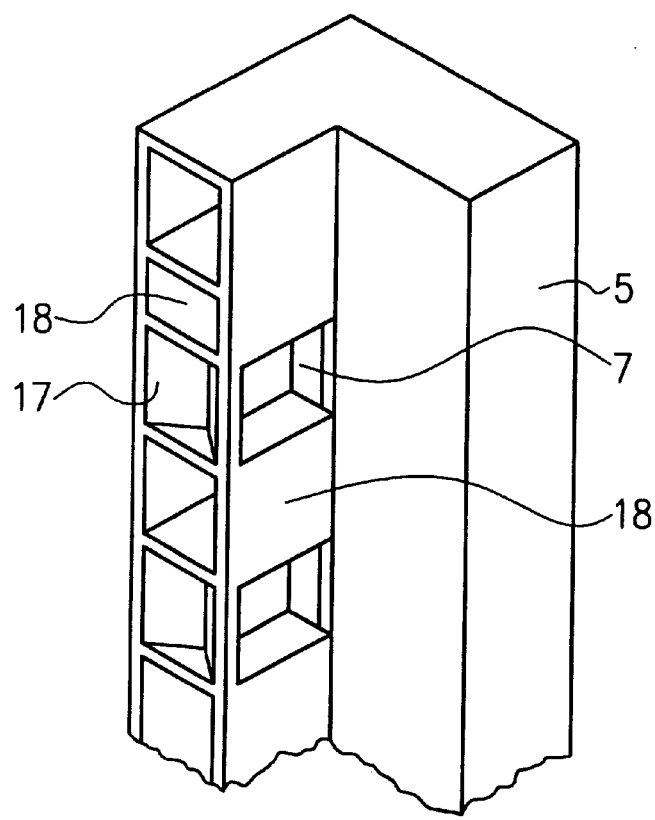
Figure 5B:
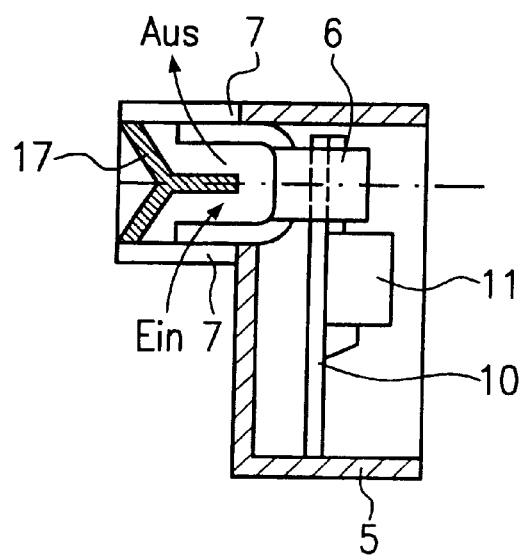
Figure 5C:
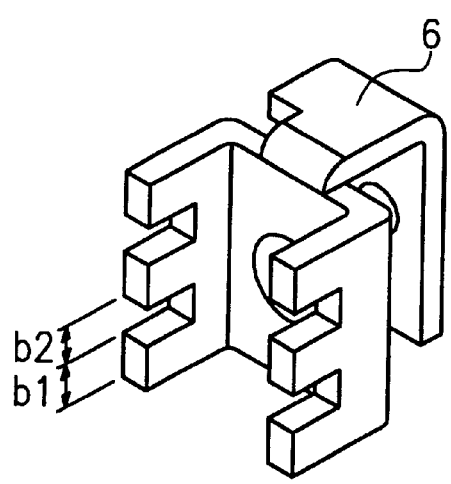
Figure 7B:
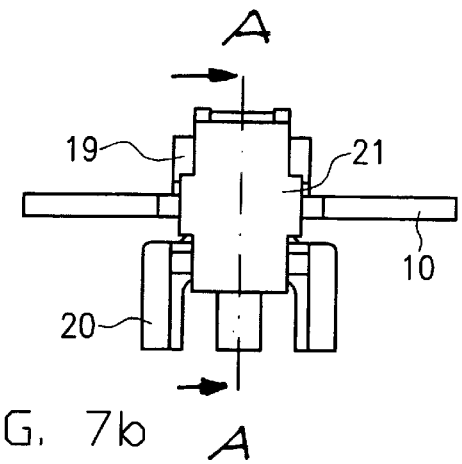
Figure 7C:
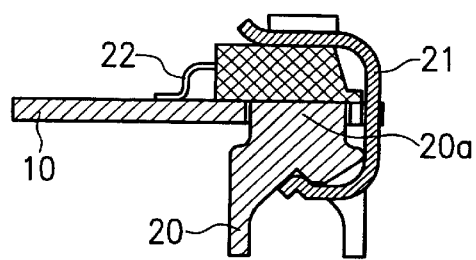
Figure 7A:
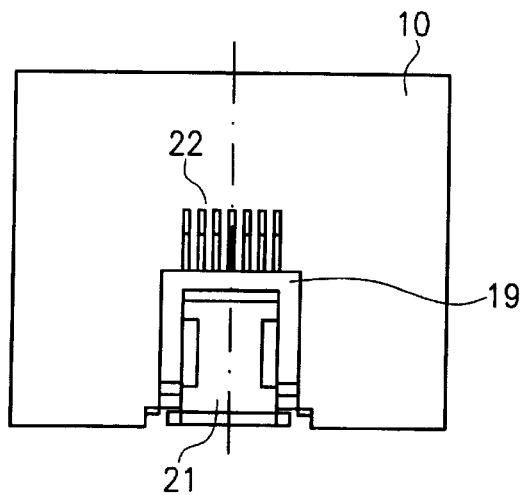
Figure 6:
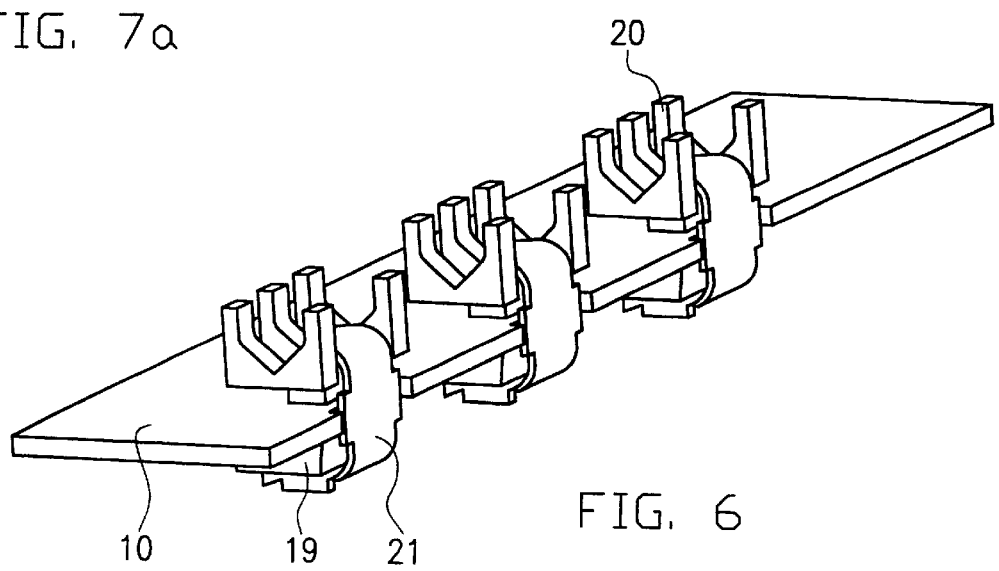

FIGS. 5a, 5b and 5c show detail views of a further embodiment of the present Invention, FIG. 6 shows a simplified perspective detail view of a realization of a further embodiment of the control device according to the present invention, and FIGS. 7a, 7b and 7c show various detail views of the structural design of the control device according to FIG. 6.

FIG. 1a shows a side view of the electric heating device 1 according to the present invention. FIG. 1b shows a top view of the electric heating device 1. The electric heating device 1 includes a heating block comprising a plurality of heating elements 2 which are arranged in layers or which are stacked. Each heating element 2 consists of a resistance heating element and of radiators or heat conducting plates which are arranged adjacent said resistance heating element. The heating elements used as resistance heating elements are preferably PTC elements. The heating block comprising the heating elements 2 is held in a frame. This frame consists of opposed longitudinal bars 3 and lateral bars 4 and 5 which are arranged at right angles thereto. The bars of the frame are produced either from metal or from plastic material.

Whereas the longitudinal bars 3 have a substantially symmetrical structural design, the two lateral bars 4 and 5 differ in the embodiment shown in FIG. 1.

In contrast to the lateral bar 4, the lateral bar 5 is implemented as a box which is open on one side thereof. The opening of this box-shaped lateral bar 5 is located on the lateral-bar side located opposite the heating elements 2. This box is adapted to have inserted therein a control device which controls the heat output of the individual heating elements 2 by controlling the current supplied to said heating elements 2. The open side of the box-shaped lateral bar 5 is closed by means of a plug-on or clip-on cover after insertion of the control circuit.

After insertion, the printed circuit board 10 of the control device is preferably arranged at right angles to the plane of the frame, but a parallel arrangement is possible as well (not shown).

The heating device 1 has current supplied thereto via two connecting pins 8. These connecting pins are implemented such that they can easily conduct the heating currents demanded. In the embodiment shown in FIG. 1, the connecting pins 8 project on the side on which the box-shaped lateral bar 5 is open.

On the same side a further plug base is provided for controlling the control device; this plug base is not shown in FIG. 1.

The lateral bar 5 has window openings 7 on the sides located in the plane of the frame. These window openings are arranged such that they, too, are positioned in the air current to be heated. Cooling elements 6 are arranged between the opposed window openings 7, said cooling elements 6 belonging to the power electronics components of the control circuit. When the heating device is in operation, air to be heated flows not only through the heating block consisting of the heating elements 2 but also through the window openings.

The amount of air flowing past the cooling elements 6 can be determined by selecting the size of the window openings 7. According to the present invention, the air flow rate is adjusted such that the differences in temperature between the air flowing through the heating block and the air flowing past the cooling bodies 6 are as small as possible. Only if the temperature of the air flowing through the window openings 7 approaches the temperature of the air flowing through the heating block as closely as possible, the heating device will be operated with the highest possible efficiency.

FIG. 2 shows a detail view of the control device arranged within the box-shaped lateral bar. A printed circuit board 10 has provided thereon a control electronics 12 in addition to the power electronics components 11. The control electronics 12 determines the amount of current which is to be delivered by the power electronics components 11, especially the power transistors, to the respective associated heating element 2. The amount of current is supplied to the control device from one of the connecting pins 8 via a conductive rail 13. The output of the power transistor 11 is fixedly soldered to the printed circuit board 10 and connected to the spring element 14 which is associated with this transistor.

The spring elements 14 are arranged on the printed circuit board in such a way that, when the control device is attached to the lateral bars 5, they are connected to connection lugs of the heating elements. Such connection lugs 15 can be seen in FIGS. 3 and 4.

In the embodiment shown, the connection lugs 15 are passed through the printed circuit board 10 in FIG. 2 and inserted into the spring elements 14. Such an arrangement permits fast mechanical fixing of the printed circuit board 10 with the control electronics in the frame. Simultaneously, electric contacting with the respective heating elements is effected.

The printed circuit board is provided with components on only one side thereof. In accordance with the number of heating stages, the printed circuit board is provided with power transistors 11 which are horizontally secured thereto. In the embodiment shown, three heating stages and, consequently, three power transistors are provided. Each power transistor 11 is fixedly soldered to the printed circuit board 10 at the output terminal thereof.

A connection lug protrudes beyond the transistor, said connection lug having a cooling element 6 secured thereto. It will be advantageous to connect the cooling element 6 to the heating element in non-conductive manner.

The cooling element 6 is provided with cooling fins, which are located in a plane that extends at right angles to the printed circuit board. In the embodiment shown, the cooling fins are, in addition, arranged on the non-equipped side of the printed circuit board. Only one leg of the cooling element 6 projects onto the equipped side of the printed circuit board and is connected to the connection lug of the transistor 11 so as to dissipate the heat produced by said transistor. In the embodiment shown, the cooling-element leg connected to the transistor 11 projects through an opening in the printed circuit board 10 onto the equipped side of the printed circuit board 10. It may, however, also project beyond the edge of the printed circuit board so that an opening in said printed circuit board 10 can be dispensed with.

A corresponding arrangement of the components comprising the transistor 11, the spring element 14 and the cooling element 6 is provided for each heating stage on the printed circuit board.

FIG. 3 shows a detail view of the box-shaped lateral bar 5 and of the control circuit which is adapted to be inserted in said lateral bar. One side of the lateral bar 5 is connected to the longitudinal bars 3 and the heating block with the heating elements 2. On the upper surface of the lateral bar 5, the window-shaped openings 7 can be seen through which the air to be heated passes.

Within the box-shaped lateral bar 5 three connection lugs 15 and one connecting pin 8a can be seen. This connecting pin represents the positive connection for all heating elements 2. This figure additionally shows a perspective view of the control device 5a which is adapted to be inserted into the box of the lateral bar 5. The control device 5a is inserted into the lateral bar 5 with the side facing said lateral bar.

On the side of the control device 5a facing the lateral bar 5, the lower surface of the printed circuit board 10 can be seen. Three cooling elements 6 project beyond this printed circuit board 10. Each of these cooling elements or cooling plates is associated with one of the power transistors 11 of a heating stage.

For each cooling element 6, complementary window openings 7 are provided in the surface of the lateral bar 5. This has the effect that, when the heating device is in operation, each cooling element has effectively supplied an air current thereto.

On the side facing away from the lateral bar, a further connecting pin 8b can be seen. This connecting pin serves as an electric ground pole when current is supplied. The connecting pin 8b is connected to the conductive bar 13 which is shown in FIGS. 2 and 4 and which supplies the heating current to individual heating stages. Each individual one of the heating stages draws via its power transistor 11 up to approx. 40 amperes from the amount of current supplied via the conductive rail 13.

FIG. 4 shows a further perspective detail view of the lateral bar 5 and of the control circuit which is adapted to be inserted into the box-shaped opening of said lateral bar 5.

In the upper area of FIG. 4, two of the window openings 7 can be seen on the surface of the lateral bar 5. These window openings are arranged in such a way that they are positioned above and below the cooling elements 6 when the control circuit has been inserted into the lateral bar 5.

Within the box-shaped opening of the lateral bar 5, the connection lugs 15 of the heating elements 2 can be seen. One respective connection lug 15 is provided for each heating stage.

In the lower half of FIG. 4, the control circuit which is adapted to be inserted into the lateral bar 5 is shown. In order to show the structural design more clearly, only one of the power transistors 11 is provided with a cooling element 6 in this case. As for the rest, the structural design of the control circuit corresponds to the control circuit described in connection with FIG. 2.

FIG. 5 shows a further embodiment of the present invention. FIGS. 5a, 5b and 5c show different detail views in which the embodiment specially differs from the preceding embodiment described.

FIG. 5a shows a slightly modified design of the lateral bar 5. The arrangement of the window openings 7 corresponds to the above-described embodiment. In order to influence the air current more accurately, walls are provided between the window openings 7 in the lateral bar 5, as far as such a provision of walls is possible without impeding the insertion of the control circuit in the lateral bar 5. All the intermediate spaces which are located on the upper side between the windows and the side facing the heating element are closed by additional walls 18. In this way, the air is prevented from flowing around aimlessly when the heating device is in operation.

FIGS. 5a and 5b show in detail how the air is conducted between the window openings 7. For accurately conducting the air, an air-conducting element 17 is inserted into the areas located between the window openings 7. As can be seen in FIG. 5b, a Y-shaped spoiler element permits a better flow of air around the cooling fins of the U-shaped cooling element 6. The respective cooling fins of the cooling element 6 are arranged adjacent the window openings 7.

In FIG. 5b the printed circuit board 10 with the power transistor 11 is additionally indicated.

FIG. 5c shows a corresponding structural design of the cooling element 6. Whereas in the above-described embodiment the substantially U-shaped cooling element 6 rests with its U-shaped side perpendicularly on the printed circuit board, the cooling body 6 according to the present embodiment is arranged in such a way that the U-shape has its lower side arranged parallel to the printed circuit board 10. Accordingly, the Y-shaped air-conducting element 17 is arranged in such a way that it projects from the lateral-bar side facing the heating elements in the direction of the control device. When a cooling body 6 according to the first embodiment is used, complementary air-conducting elements can be arranged on the lateral boundaries between the opposed window openings 7.

In the embodiment shown in FIG. 5c, the width b1 of one cooling fin is approx. 3 mm, whereas the distance b2 between the cooling fins is slightly smaller, approx. 2.5 mm. The cooling body is preferably produced from aluminium or copper.

In FIGS. 6 and 7, a further embodiment of a control device according to the present invention is shown. In this embodiment, especially the structural design of the power transistors and of the cooling bodies differs from that of the preceding embodiments. The cooling bodies 20 according to this embodiment are connected in a different way to the power transistors. In the preceding embodiments, the power transistors 11 have cooling vanes formed thereon, which project beyond the power transistor on one side thereof. The cooling bodies of the above-described embodiments are secured to these cooling vanes. The cooling vanes of the power transistors are soldered to the printed circuit board. In the embodiment described in the following, the cooling bodies are connected to the transistor by means of a clipped connection. In FIGS. 6 and 7 it is shown that the cooling bodies 20 of this embodiment have a special structural design. In order to permit a clip 21 to engage, the cooling fins of the cooling body 20 have a non-symmetrical structural design. For this purpose, the preferably U-shaped cooling body has on one side thereof a smaller number of fins than is normally the case so as to permit the clip 21 to engage. The clip preferably engages the power transistor 19 and the cooling body 20 from outside and secures the cooling body 20 to the control device and the transistor 19 in this way.

This embodiment is particularly suitable for SMD-type power transistors. It is a construction-dependent property of SMD-type transistors that they are not provided with cooling vanes to which the cooling body can be secured. In order to be able to connect the cooling body to the lower surface of the power transistor 19, the printed circuit board has a hole provided therein and this hole has preferably a diameter of approx. 7.5 mm.

Accordingly, the cooling body 20 is provided with pin 20a on the lower side thereof. In the embodiment shown, this pin projects in a direction opposite to the direction of the individual cooling fins. The diameter of the pin 20a is preferably approx. 7 mm.

The pin 20a formed on the cooling body 20 projects through the hole in the printed circuit board 10 and contacts the transistor 19 directly.

This structural design is shown in FIGS. 7a, 7b and 7c in detail. FIG. 7a shows a top view of the printed circuit board 10 having the power transistor 11 provided thereon. The power transistor 11 is arranged on the boundary of the printed circuit board 10 so that the clip 21 used for fixing the cooling body 20 can be fastened easily. The printed circuit board may be provided with a small indentation at the location at which the clip 21 engages the printed circuit board from above and from below so that said clip 21 will not necessitate a larger construction depth of the printed circuit board 10. Preferably, the depth of this indentation corresponds approximately to the thickness of the clip 21 in this area. The transistor 19 is preferably arranged in such a way that connection contacts 22 point towards the opposite edge of the printed circuit board 10.

FIG. 7b shows a side view. FIG. 7c shows a sectional view along the sectional line A—A in FIG. 7b. FIG. 7c shows that the cooling body 20 and the spring 21 are geometrically adapted to one another in such a way that correctly positioned fixing with an optimum pressure application point is guaranteed.

What is claimed is:

1. An electric heating device, especially for use as a supplementary electric heating for motor vehicles, comprising:
    a plurality of heating elements (2) which are combined so as to form a heating block, said heating block being held in a rectangular frame (3, 4, 5), and
    a control device for controlling the heating elements (2), said control device defining a structural unit with the heating block held in the frame (3, 4, 5) and being provided with power transistors (11) which are arranged on a printed circuit board (10) and which are each provided with a cooling element (6), wherein the frame is defined by opposed longitudinal bars (3) and lateral bars (4, 5) arranged at right angles to said longitudinal bars (3), at least one of said lateral bars (5) is implemented as a box which is open on one side thereof and which is adapted to have the control device inserted therein, window openings (7) are provided in said lateral bar (5) and the cooling elements (6) of the power transistors (11) are located between respective opposed window openings (7) in the inserted condition of the control device.

2. An electric heating device according to claim 1, wherein means (17) for influencing the air current are provided between said opposed window openings (7).

3. An electric heating device according to claim 1, wherein the cooling elements (6) are each U-shaped and wherein the respective opposed legs of the cooling elements (6) are arranged adjacent the window openings (7) in the inserted condition of the control device.

4. An electric heating device according to claim 3, wherein air-conducting means (17) are provided between said opposed window openings (7) said air-conducting means projecting between the legs of the U-shaped cooling elements (6).

5. An electric heating device according to one of the claims 1, wherein each cooling element (20) has a pin (20a) which, extending through an opening provided in the printed circuit board (10), establishes a connection between said cooling element (20) and the transistor (19).

6. An electric heating device according to one of the claims 1, wherein each of the cooling elements (20) is secured in position by means of a spring (21).

7. An electric heating device according to one of the claims 2, wherein the window openings (7) and/or the means (17) for influencing the air current are implemented such that air can flow around components of the control device which are located on the printed circuit board (10).

8. An electric heating device according to one of the claims 1, wherein the printed circuit board (10) of the control device is equipped with components on only one side thereof.

9. An electric heating device according to one of the claims 1, wherein the printed circuit board (10) is arranged at right angles to the plane of the frame and is implemented such that its length corresponds substantially to that of the lateral bar (5).

10. An electric heating device according to one of the claims 1, wherein the control device is adapted to be fixed in the lateral bar (5) by means of electric connection lugs (15) which project from the heating elements (2) into the interior of said lateral bar (5).

11. An electric heating device according to claim 10, wherein spring elements (14) for receiving the connection lugs (15) are provided on the printed circuit board (10), said spring elements (14) being complementary to the connection lugs (15).

12. An electric heating device according to claim 1, wherein the open side of the box-shaped lateral bar (5) can be closed by means of a plug-on or clip-on cover.

\* \* \* \* \*

UNITED STATES PATENT AND TRADEMARK OFFICE
CERTIFICATE OF CORRECTION

PATENT NO.    : 6,392,207 B2
DATED         : May 21, 2002
INVENTOR(S)   : Klaus Beetz and Franz Bohlender It is certified that error appears in the above-identified patent and that said Letters Patent is hereby corrected as shown below:

<u>Title page,</u>
Please add:
-- [30] Foreign Application Priority Data
May 23, 2000 (EP) ……………….. 00111120.2 --.

Signed and Sealed this

Seventeenth Day of June, 2003

JAMES E. ROGAN
*Director of the United States Patent and Trademark Office*